United States Patent [19]

Inoue et al.

[11] Patent Number: 5,699,612
[45] Date of Patent: Dec. 23, 1997

[54] METHOD OF CHECKING CONNECTED STATE BETWEEN IC SOCKET AND PRINTED WIRING BOARD

[75] Inventors: Shuji Inoue, Ibaragi; Kazuhisa Ozawa, Saitama, both of Japan

[73] Assignee: Intel Corporation, Santa Clara, Calif.

[21] Appl. No.: 618,686

[22] Filed: Mar. 20, 1996

Related U.S. Application Data

[62] Division of Ser. No. 342,379, Nov. 18, 1994.

[30] Foreign Application Priority Data

Mar. 17, 1994 [JP] Japan .................... 6-071270

[51] Int. Cl.⁶ .................................................. H01K 9/00
[52] U.S. Cl. .................. 29/843; 174/262; 174/263; 228/105; 324/538
[58] Field of Search ................ 29/843; 439/83, 439/876; 228/103, 105; 324/538; 174/262, 263, 264

[56] References Cited

U.S. PATENT DOCUMENTS

| | | | |
|---|---|---|---|
| 3,880,486 | 4/1975 | Avakian | 174/262 |
| 4,696,104 | 9/1987 | Vanzetti et al. | 228/103 |
| 4,812,130 | 3/1989 | Altenschulte et al. | 439/84 |
| 4,854,882 | 8/1989 | Corridori | 439/876 |
| 4,950,170 | 8/1990 | Miller, Jr. | 439/74 |
| 4,953,060 | 8/1990 | Lauffer et al. | 361/388 |
| 5,322,446 | 6/1994 | Cearley-Cabbiness | 439/73 |
| 5,340,947 | 8/1994 | Credle et al. | 174/262 |
| 5,386,626 | 2/1995 | Cheng | 29/843 |
| 5,485,351 | 1/1996 | Hopfer et al. | 361/704 |

OTHER PUBLICATIONS

IBM Technical Disclosure Bulletin vol. 20 No. 11B, Apr., 1978. V.Y. Doo, "Liquid Metal Multihead Connector".

Primary Examiner—P. W. Echols
Attorney, Agent, or Firm—Blakely, Sokoloff, Taylor & Zafman

[57] ABSTRACT

An IC socket for mounting an IC package on a printed wiring board includes a socket body and pin terminals. The socket body has a mount portion for the IC package. The mount portion has a flat bottom wall. The pin terminals are arranged in the bottom wall at predetermined intervals lengthwise and widthwise. Each pin terminal has a contact portion, on the upper surface of the mount portion, which is brought into contact with a corresponding terminal of the IC package mounted on the mount portion, and a connecting portion, on the lower surface of the mount portion, which is connected to a corresponding pattern on the printed wiring board. A press member having elasticity which makes the press member press an upper surface of the IC package mounted on the socket body to press each terminal of the IC package against the contact portion of a corresponding pin terminal of the socket body is arranged on the socket body. A method of checking whether the connecting portion of each pin terminal is properly connected to a corresponding pattern on a printed wiring board by soldering is also disclosed.

17 Claims, 8 Drawing Sheets

FIG. 5

| Step | Before Mounting | After Mounting |
|---|---|---|
| Fluoroscopic Image | | OK  NG |
| Soft X-Ray Photograph | | |

Heating

Heating

Heating

5,699,612

METHOD OF CHECKING CONNECTED STATE BETWEEN IC SOCKET AND PRINTED WIRING BOARD

This is a divisional of application Ser. No. 08/342,379, filed Nov. 18, 1994.

BACKGROUND OF THE INVENTION

The present invention relates to an IC socket used to mount an IC package having terminals distributed/arranged on its lower surface on a printed wiring board, and a method of checking a connected state between each pin terminal and a corresponding pattern (land) of the printed wiring board on the lower surface of the IC socket.

According to a conventional technique, when an IC package having terminals directly formed on its lower surface is to be mounted on a printed wiring board, the terminals are directly soldered to the patterns (lands) of the board. Especially in the case of a PGA (Pin Grid Array) type package, the package is mounted on the opposite surface of a printed wiring board to its pattern surface; pin terminals are exposed on the pattern surface via through holes in the printed wiring board; and the pin terminals are soldered to the patterns all together in a reflow furnace or the like.

In the case of a BGA (Ball Grid Array) type package, however, since the package is mounted on the pattern surface of a printed wiring board, it is possible to easily check the quality of soldering between each ball pump type terminal and a corresponding pattern (land) of the board. As a checking method for this type of package, a method of using soft x-rays is known. As shown in FIG. 5, this method is based on the phenomenon that when soldering of each terminal to a corresponding land is completed, the resultant soft x-ray image looks magnified. In addition, in order to prevent damage to an expensive IC package, a special IC socket is mounted first on a printed wiring board, and the above IC pattern is then mounted on the IC socket. Even in this method, when the lower surface of the IC socket is connected to the upper surface of the printed wiring board so as to connect the IC socket to the pattern surface of the printed wiring board, a conventional checking method using an expensive soft x-ray apparatus is the only method of checking the quality of soldering.

Such a connected portion may be checked by directly supplying a current thereto without checking a soldered portion. However, in this method, a short circuit due to a solder on the connected portion may occurs. Hence, the method is too dangerous.

Furthermore, when a soldering defect is found by a check conducted after a soldering process, the IC package must be removed. At this time, this expensive IC package may be damaged.

SUMMARY OF THE INVENTION

The present invention has been made to solve the above problems, and has as its object to provide an IC socket which allows safe and reliable mounting of a PGA type IC package and especially a BGA type IC package on a printed wiring board by a method of using a special socket, checking the quality of soldering before an IC package is mounted, and mounting the IC package on the socket, and a method of checking a soldered state between each connecting portion of the IC socket and a corresponding pattern on the printed wiring board.

In order to achieve the above object, according to the present invention, there is provided an IC socket for mounting an IC package on a printed wiring board, comprising a socket body having a mount portion for the IC package, the mount portion having a flat bottom wall, and pin terminals arranged in the bottom wall at predetermined intervals lengthwise and widthwise, each of the pin terminals having a contact portion, on an upper surface of the mount portion, which is brought into contact with a corresponding terminal of the IC package mounted on the mount portion, and a connecting portion, on a lower surface of the mount portion, which is connected to a corresponding pattern on the printed wiring board, wherein a press member having elasticity which makes the press member press an upper surface of the IC package mounted on the socket body to press each terminal of the IC package against the contact portion of a corresponding pin terminal of the socket body is arranged on the socket body.

BRIEF DESCRIPTION OF THE DRAWINGS

FIGS. 1A and 1B are sectional views of IC sockets according to the present invention, in which FIG. 1A shows a socket having pin terminals connected to patterns on the upper surface of a printed wiring board, and FIG. 1B shows a socket having terminals connected to patterns on the lower surface of a printed wiring board via through holes formed therein;

FIGS. 2A to 2C are sectional views of pin terminals used for the above IC sockets, in which FIG. 2A shows a pin terminal for the IC socket mounted on the pattern surface of a printed wiring board, FIG. 2B shows a pin terminal for the IC socket mounted on the opposite surface of a printed wiring board to the pattern surface, and FIG. 2C shows a pin terminal having a conductive elastic member inserted between a contact portion and a connecting portion;

FIGS. 3A to 3E are views for explaining the steps in mounting an IC socket on the pattern surface of a printed wiring board, in which FIG. 3A is a side of the printed wiring board, FIG. 3D is a side view of the printed wiring board having a cream solder coated thereon, FIG. 3C is a partial sectional view showing a state wherein the pin terminals of the IC socket are mounted on the cream solder, FIG. 3D is a partial sectional view of the structure obtained after a process in a reflow furnace, and FIG. 3E is a view showing a state wherein the structure is visually checked after a soldering process;

FIGS. 4A and 4B are sectional views showing a state wherein a BGA type IC package is mounted on a printed wiring board, in which FIG. 4A shows a case wherein an IC socket is mounted on the pattern surface of the printed wiring board, and FIG. 4B shows a case wherein an IC socket is mounted on the opposite surface to the pattern surface;

FIG. 5 is a table for explaining a check method using soft x-rays;

FIGS. 6A to 6C are views for explaining a direct visual check method, in which FIG. 6A is a plan view of an IC socket, FIG. 6B is a longitudinal sectional view of the IC socket, and FIG. 6C is a view for explaining lands on a printed wiring board in this check method;

FIGS. 7A and 7B are views for explaining an operation in a case wherein each pin terminal has a large through hole, in which FIG. 7A is a partial sectional view of an IC socket mounted on a printed wiring board, and FIG. 7B is a partial sectional view showing a state of the above structure after a heating operation;

FIGS. 8A to 8D are views for explaining a case wherein each pin terminal has a small through hole, in which FIG. 8A is a partial sectional view of an IC socket mounted on a printed wiring board, FIG. 8B is a partial sectional view showing a state of the above structure after a heating operation, and FIGS. 8C and 8D are partial sectional views of pin terminals with through holes having different shapes; and FIGS. 9A and 9B are views for explaining an operation in a case wherein a pin terminal plated with gold is used, in which FIG. 9A is a partial sectional view of an IC socket mounted on a printed wiring board, and FIG. 9B is a partial sectional view showing a state of the above structure after a heating operation.

DESCRIPTION OF THE PREFERRED EMBODIMENTS

The present invention will be described below with reference to the accompanying drawings.

Figure 1A:
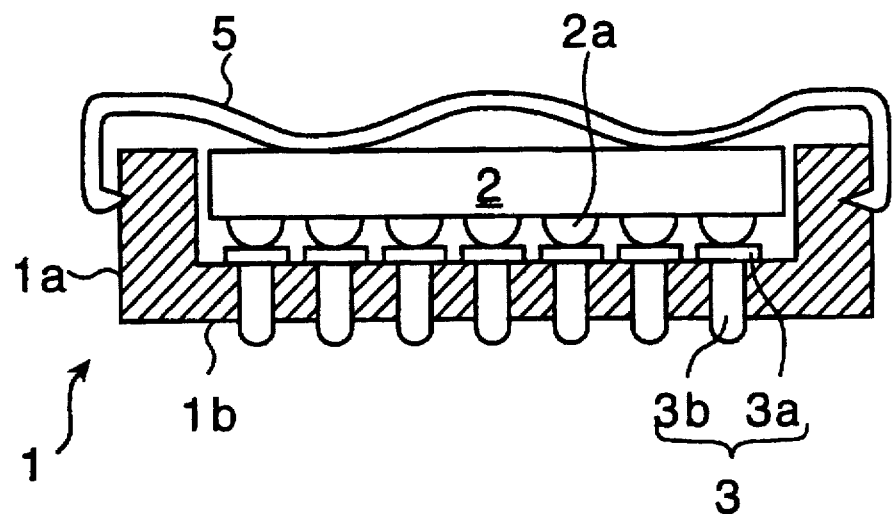
Figure 1B:
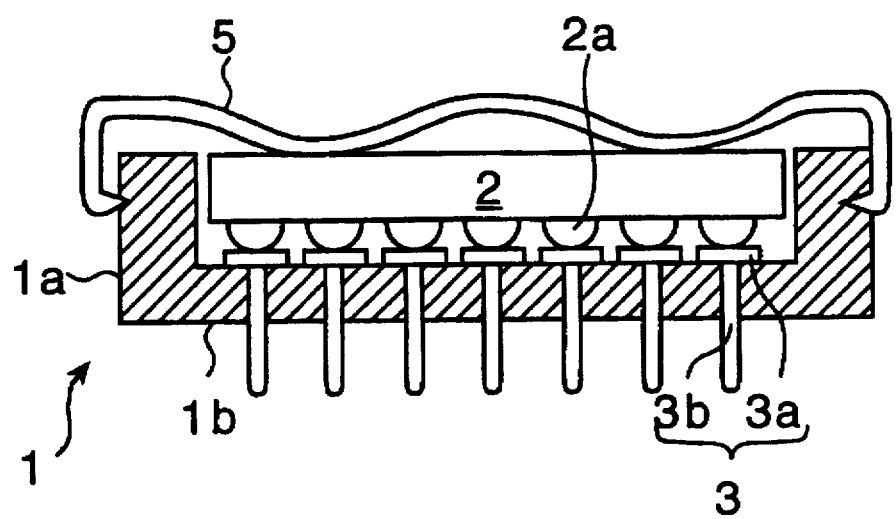

FIGS. 1A and 1B show IC sockets of the present invention. FIG. 1A shows an IC socket designed for connection to patterns on the upper surface of a printed wiring board. FIG. 1D shows an IC socket designed for connection to patterns on the lower surface of a printed wiring board via through holes formed therein.

Each IC socket is constituted by a socket body 1, pin terminals 3, and a press member 5. The socket body 1 has a pier-like frame (mount portion) 1a formed on its periphery, and a flat and rectangular bottom wall 1b. The pin terminals 3 extend through the bottom wall 1b to be arranged at predetermined intervals lengthwise and widthwise. Each pin terminal 3 has a contact portion 3a, on the upper surface of the frame 1a, which is brought into contact with a terminal 2a of an IC package 2 mounted on the frame 1a, and a connecting portion 3b, on the lower surface of the frame 1a, which is connected to a pattern (land) 4a of a printed wiring board 4 (to be described later). The press member 5 is locked to the outer portions of the pier-like frame 1a and has elasticity which makes the press member press the mounted IC package 2 from above to press each terminal 2a of the IC package 2 against the contact portion 3a of a corresponding pin terminal 3 of the socket body 1.

In the case shown in FIG. 1A, the socket body 1 needs to be made of a transparent member (synthetic resin, glass, or the like) to directly and visually check whether the connecting portion 3b of each pin terminal 3 is completely soldered to a corresponding pattern 4a on the printed wiring board 4. In the case shown in FIG. 1B, however, the socket body 1 need not be made of a transparent member because soldering is performed on the opposite surface to the surface on which the IC socket is mounted.

Figure 2A:
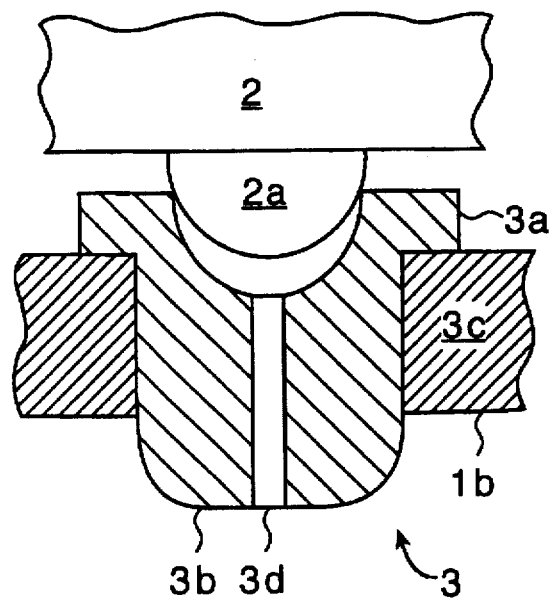

If the IC package is of a BGA type, each terminal 2a is of a ball bump type. If the distal end portion of this terminal 2a is directly pressed against the contact portion 3a of the pin terminal 3, the surface of the distal end is damaged, e.g., depressed. As a result, the height of the terminal 2a is changed. For this reason, as shown in FIG. 2A, a recess portion 3c is formed in the surface of the contact portion 3a. That is, contact between the ball bump type terminal 2a and the contact portion 3a is designed such that the side surface of the terminal is brought into contact with the peripheral portion of the recess portion 3c.

When the IC socket is to be mounted on the surface, of the printed wiring board 4, on which the patterns 4a are formed, the connecting portion 3b of the pin terminal 3 which is connected to the pattern 4a on the printed wiring board 4 has a short projection-like shape like the ones shown in FIGS. 1A and 2A. When the IC socket is to be mounted on the opposite surface of the printed wiring board 4 to the patterns 4a, the connecting portion 3b has an elongated shape like the ones shown in FIGS. 1B and 2B so as to protrude from the surface having the patterns 4a via a through hole formed in a portion corresponding to the pattern 4a on the printed wiring board 4.

Figure 2B:
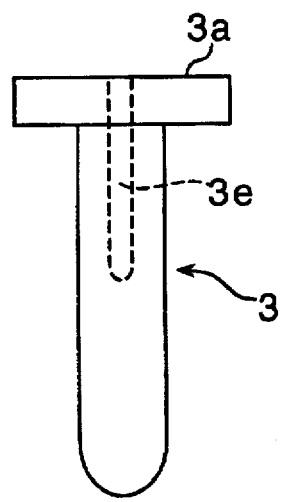
Figure 2C:
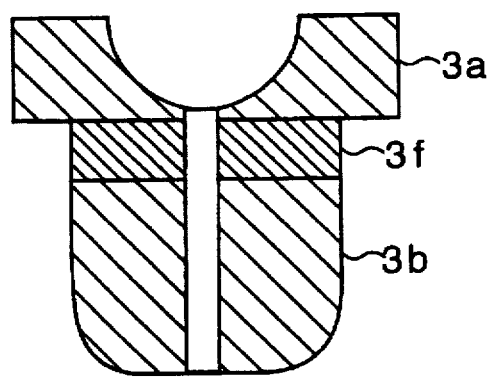

Note that an insertion hole 3e is formed in the pin terminal 3 shown in FIG. 2B. The terminal 2a having a PGA type pin-like shape is inserted halfway into the insertion hole 3e from the contact portion 3a as the upper surface of the pin terminal 3. In addition, the pin terminal 3 shown in FIG. 2C is designed such that conductive rubber 3f is bonded between the contact portion 3a and the connecting portion 3b with a conductive adhesive to ensure elasticity between the contact portion 3a and the connecting portion 3b.

Figure 3A:
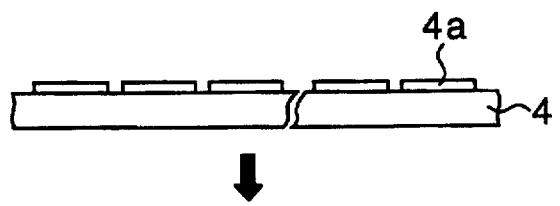
Figure 3B:
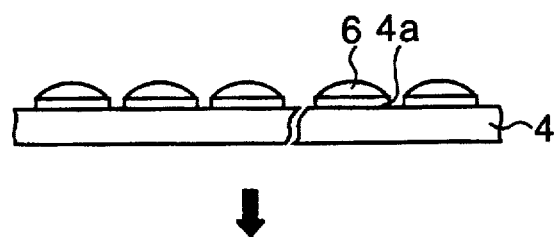
Figure 3C:
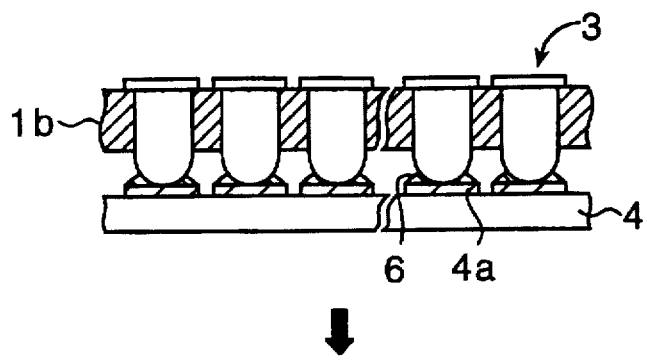

The steps in mounting an IC package on the printed wiring board 4 by using each of the above-described IC sockets will be described below. FIGS. 3A to 3E show the steps corresponding to the case shown in FIG. 1A. FIG. 3A shows the printed wiring board 4. FIG. 3B shows a state wherein a cream solder 6 is coated on lands 1a.

Figure 3D:
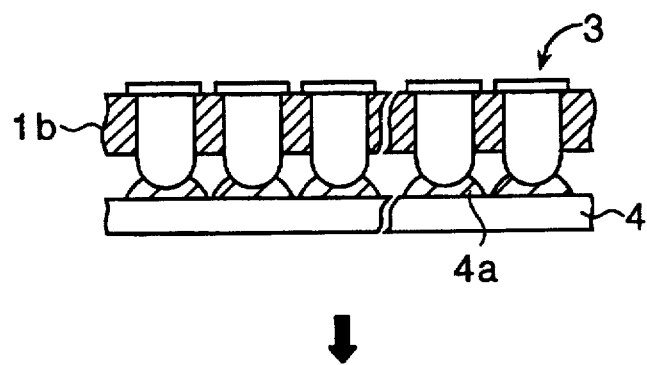

The IC socket having the short projection-like connecting portions 3b shown in FIG. 1A is positioned visually through the transparent socket body 1 such that the connecting portions 3b coincide with the lands 4a. As a result, the IC socket is mounted on the printed wiring board 4 in the state shown in FIG. 3C. The overall resultant structure is then heated in a reflow furnace to a temperature at which the solder melts. As shown in FIG. 3D, the cream solder 6 is melted first and then solidified. Consequently, the connecting portions 3b are completely soldered to the lands 4a.

Figure 3E:
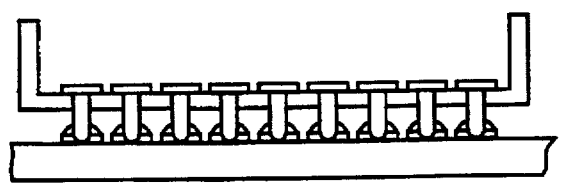

In this state, as shown in FIG. 3E, the quality of the soldering is checked through the transparent socket body 1 from above.

Figure 4:
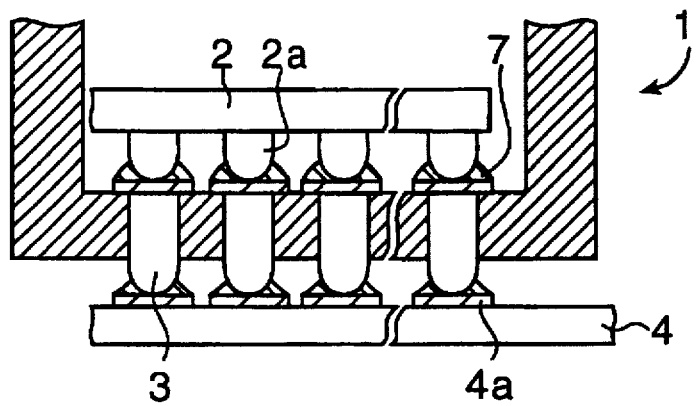
Figure 4:
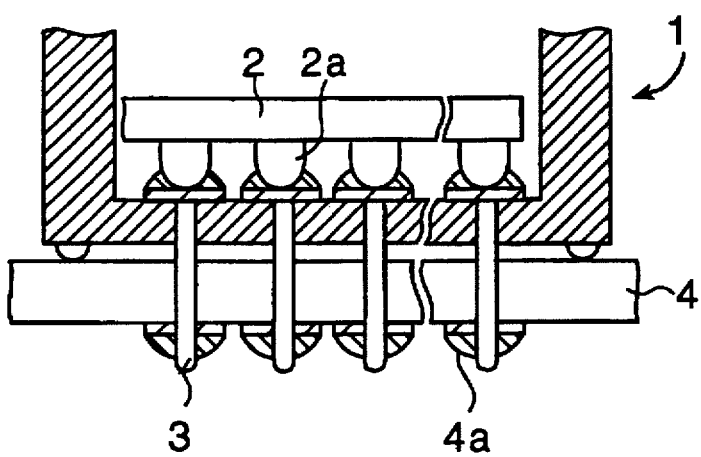

After the IC socket is completely mounted on all the necessary portions of the printed wiring board 4 in this manner, a silver-based conductive agent or conductive rubber 7 is coated on the upper surface of the contact portion 3a of each pin terminal 3. The IC package 2 is mounted on the resultant structure and fixed by the press member 5. This state is shown in FIG. 4A. Note that the press member 5 need not press the ball bump type terminals against the connecting portions 3a with a large pressing force. That is, the pressing force of the press member 5 may be set such that the overall IC socket is not moved.

Instead of the above silver-based conductive agent or the conductive rubber 7, anisotropic conductive rubber formed by distributing metal wires vertically on a silicone rubber plate at small intervals to extend therethrough may be spread in the frame 1a of the socket body 1, and the BGA type IC package 2 may be mounted thereon.

When the IC package 2 having the PGA type terminals 2a is to be used, each pin terminal 3 of the IC socket is designed such that the insertion hole 3e is formed in the contact portion 3a, and the connecting portion 3b is elongated, as shown in FIGS. 1B and 2B. In this case, as shown in FIG. 4B, the connecting portion 3b of the pin terminal 3 is connected to the land 3a on the opposite surface via the through hole in the printed wiring board 4. Since other arrangements are the same as those shown in FIG. 4A, a description thereof will be omitted.

Figure 6A:
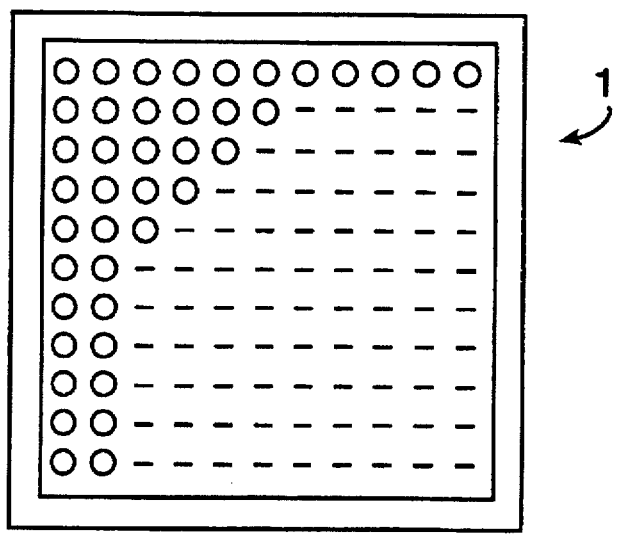
Figure 6B:
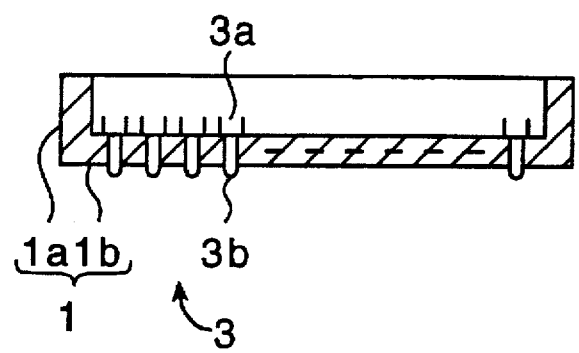
Figure 6C:
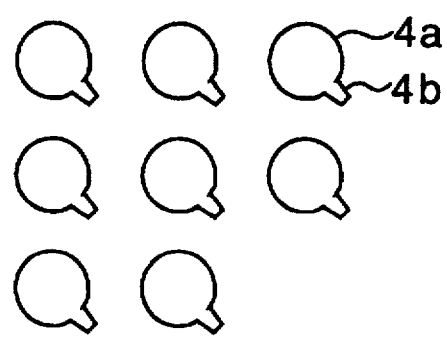

A visual check method will be described next with reference to FIGS. 6A to 6C. In this check method, the socket body 1 must be transparent and is made of a transparent member (synthetic resin, glass, or the like) in practice. FIGS. 6A to 6C illustrate lands on a printed wiring board in the check method.

This socket body 1 is made of a transparent member and has a rectangular shape. The socket body 1 is constituted by a frame 1a formed vertically on the respective sides of the socket body 1, and a flat bottom wall 1b. Pin terminals 3 are arranged in the bottom wall 1b at predetermined intervals lengthwise and widthwise to extend therethrough such that connecting portions 3b protrude downward from the bottom wall 1b.

A method of mounting the socket body 1 having the above pin terminals 3 extending vertically therefrom on a printed wiring board 4 will be described next. As shown in FIG. 6C, lands 4a on the printed wiring board 4 have protruding portions 4b which protrude from the respective lands 4a so as not to come into contact with the adjacent lands 4a.

A cream solder 6 is coated on only the lands 4a on the printed wiring board 4 shown in FIG. 3A in advance (not coated on the protruding portions 4b).

The connecting portions 3b of the pin terminals 3 of the socket body 1 are positioned to the lands 4a, on which the cream solder 6 is coated, by a proper method such that the connecting portions 3b are mounted on the respective lands 4a. The overall resultant structure is then heated in a reflow furnace to melt the cream solder, thereby soldering the lands 4a to the connecting portions 3b.

In this case, the molten cream solder 6 on each land 4a flows to the protruding portion 4b, and the color of the surface of the copper foil pattern 4a is changed to the solder color (the same is true of the land and the protruding portion). This facilitates visual recognition.

Note that the above lands 4a and the like are arranged at very small intervals, and the lands 4a themselves are very small. Therefore, it is difficult to identify them by the naked eye. In this case, the lands 4a can be easily identified by using a currently available image checker or the like.

An indirect visual check method will be described next. As shown in FIG. 2A, each pin terminal 3 used for this indirect visual check method has a contact portion 3a formed on the upper end in the form of a collar, and a connecting portion 3b formed on the lower end. The connecting portion 3b protrudes from the lower surface of a bottom wall 1b of a socket body 1 to be capable of being connected to a pattern (land) 4a on a printed wiring board 4. A recess portion 3c is formed in the upper surface of the contact portion 3a such that the side surface of a ball bump type terminal 2a of a BGA type IC package 2 can be brought into contact with the recess portion 3c.

A method of mounting the socket body 1 having these pin terminals 3 vertically extending therefrom on the printed wiring board 4 will be described next.

As shown in FIG. 2A, a through hole 3d is formed in the center of each pin terminal 3. The diameter of this through hole 3d is either set to be relatively large so as not to cause a capillary phenomenon of a molten solder, or set to be small to cause a capillary phenomenon of a molten solder.

Figure 7A:
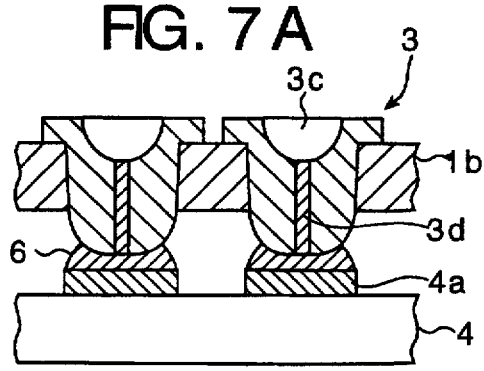

The case of the large through hole 3d shown in FIGS. 7A and 7B will be described first. In this case, the through holes 3d of the pin terminals 3 are filled with a solder in advance. A cream solder 6 is coated on the lands 4a. Thereafter, the IC socket positioned by a proper method is mounted on the printed wiring board 4 such that the connecting portions 3b of the pin terminals 3 are mounted on the lands 4a. FIG. 7A shows this state.

The printed wiring board 4 in this state is heated in a reflow furnace. Upon this heating, the cream solder 6 is melted to join the connecting portions 3b of the pin terminals 3 to the lands 4a. At the same time, the solder in the through hole 3d of each pin terminal 3 is melted to flow to the liquified solder portion, on the land 4a, which is formed when the cream solder 6 is melted. As a result, the solder surface descends. FIG. 7B shows this state.

This descent of the solder surface is detected by an image checker or the like. Detection of the descent of a solder surface indicates that the land 4a and the connecting portion 3b are connected to each other by the solder at the corresponding portion. Therefore, whether a connection is made can be detected.

Figure 8A:
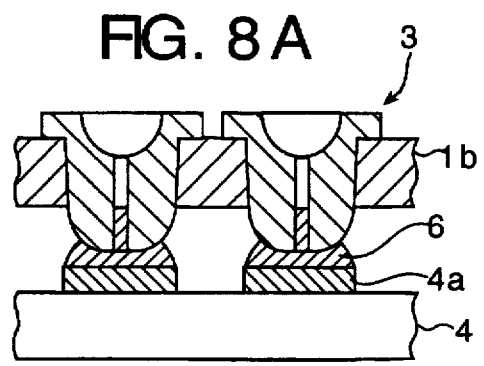

In the case of the small through hole 3d shown in FIGS. 8A to 8D will be described next. In this case, a small amount of solder is filled in the lower portion of the through hole 3d of each pin terminal 3 in advance. The cream solder 6 is coated on the lands 4a. Thereafter, the IC socket positioned by a proper method is mounted on the printed wiring board 4 such that the connecting portions 3b of the pin terminals 3 are mounted on the respective lands 4a. FIG. 8A shows this state.

Figure 8B:
Figure 8B:
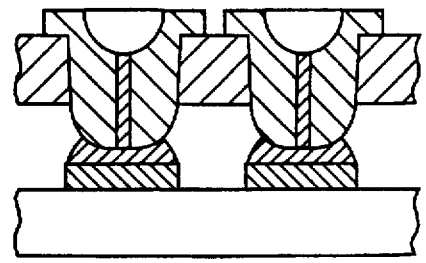

The printed wiring board 4 in this state is heated in a reflow furnace. Upon this heating, the cream solder 6 is melted to join the lands 4a to the connecting portions 3b of the pin terminals 3. At the same time, the small amount of solder in the through hole 3d of each pin terminal 3 is melted, and a liquified solder is sucked up into the through hole 3d from a liquified solder portion, on the land 4a, which is formed when the cream solder 6 is melted, by a capillary phenomenon. As a result, the solder surface ascends. FIG. 8B shows this state.

Figure 8C:
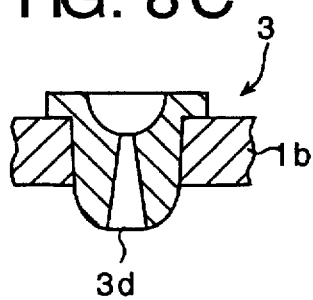
Figure 8D:
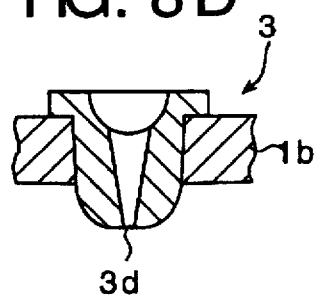

Note that each through hole 3d preferably has the shape shown in FIG. 8C or 8D. This ascent of the solder surface is detected by an image checker or the like. Detection of the ascent of a solder surface indicates that the land 4a and the connecting portion 3b are connected to each other by the solder at the corresponding portion. Therefore, whether connection is made can be detected.

Figure 7B:
Figure 7B:
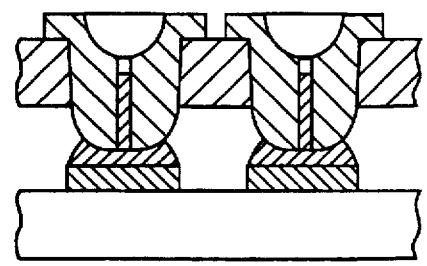
Figure 9A:
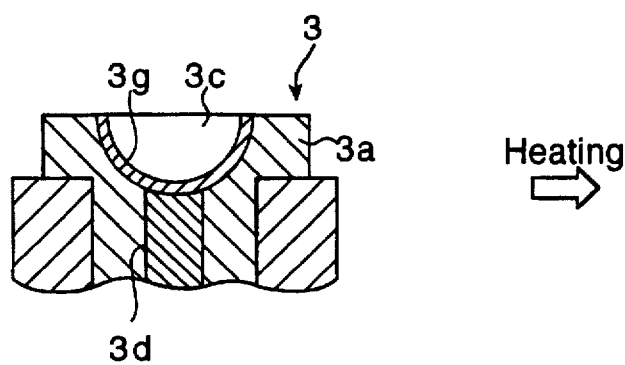
Figure 9B:
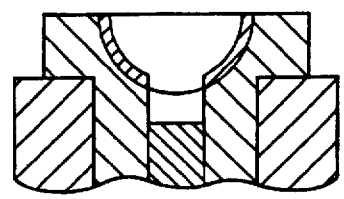

In the case shown in FIGS. 9A and 9B, a through hole 3d is filled with a solder, similar to the case shown in FIGS. 7A and 7B. In addition, gold plating 3g is formed on the inner surface of each recess portion 3c in the upper surface and on the solder surface on the upper end of each through hole 3d. By using these pin terminals 3, the IC socket positioned by a proper method is mounted on a printed wiring board 4 such that connecting portions 3b of the pin terminals 3 are mounted on lands 4a, similar to the case shown in FIGS. 7A and 7B. FIG. 9A shows this state.

The printed wiring board 4 in this state is heated in a reflow furnace. Upon this heating, a cream solder 6 is melted to join the lands 4a to the connecting portions 3b of the pin terminals 3. At the same time, the gold plating on the solder surface is diffused in the liquified solder in the through hole 3d, and the gold is discolored to the solder color. FIG. 9B shows this state.

This discoloring and descent of the solder surface are checked by an image checker or the like. Detection of discoloring and the descent of a solder surface indicates that the land 4a and the connecting portion 3b are connected to each other by the solder at the corresponding portion. Therefore, whether connection is made can be detected.

As has been described above, according to the present invention, since a printed wiring board is caused to pass through a reflow furnace when an IC socket is mounted on the board before an IC package is mounted thereon, the IC package is free from distortion and damage due to heat. In addition, since the IC package can be easily replaced, a repair can be made.

If an IC socket is made of a transparent member, positioning between each pin terminal and a corresponding land can be easily performed when the IC socket is mounted on the printed wiring board. In addition, a visual check on the quality of soldering after a soldering process can be easily performed.

If each pin terminal of an IC socket is elongated, a BGA type IC package can also be mounted on a printed wiring board for a PGA type.

If a recess portion is formed in the upper surface of each pin terminal of an IC socket, the pin terminal can be brought into contact with the circumferential surface of a ball bump type terminal of a BGA type IC package. With this arrangement, damage to the distal end face of each terminal can be prevented, and the pin terminals are free from variations in height. Therefore, this arrangement is suitable for the reuse of the package.

If a connecting pin insertion hole is formed in each pin terminal of a PGA type IC package, the package can be used as either of BGA and PGA type packages.

After an IC socket is positioned and mounted on a printed wiring board, the overall resultant structure is heated in a reflow furnace. At this time, however, an IC package is not mounted on the printed wiring board yet, and hence a deterioration in the IC package due to heat can be prevented.

Contact between the ball bum type terminals of an IC package and the contact portions of the pin terminals of an IC socket is made by a silver-based conductive agent, conductive rubber, anisotropic conductive rubber, or the like. At this time, the IC package is not heated. Therefore, the IC package is free from a deterioration by heat.

When an IC package needs to be replaced because of changes in circuit characteristics or the like after the IC package is mounted on a printed wiring board, the IC package can be easily removed from the board. Therefore, the expensive IC package is free from damage.

Furthermore, an indirect check on the quality of soldering can be easily made by visually checking the descent or ascent of a solder surface in a through hole formed in the center of each pin terminal of a socket.

What is claimed is:

1. A method of checking whether a connecting portion of a pin terminal of an IC socket for an IC package is properly connected to a pattern on an upper surface of a printed wiring board by soldering, wherein said pin terminal has a through hole formed therein in an axial direction, said method comprising the step of:

visually recognizing a change in position of a surface of a solder, in the through hole, which is melted when the connecting portion between said IC socket and said printed wiring board is heated.

2. A method according to claim 1, wherein said through hole is filled with a solder and wherein said step of visually recognizing the change in state of the through hole comprises the step of visually recognizing a descent of a solder surface in the through hole when the melted solder flows between the connecting portion and the pattern.

3. A method according to claim 2 wherein the solder is filled in the through hole in said pin terminal, and a gold plating is formed on a peripheral portion of the through hole, located on an upper surface of said pin terminal and on the solder surface exposed on an upper end of the through hole, wherein said step of visually recognizing a change in said state of the through hole further comprises the step of visually recognizing a change in color of a golden portion of the upper surface when the connecting portion between said IC socket and the printed wiring board is heated, and the solder is melted.

4. A method according to claim 1 wherein said through hole has a diameter sufficiently small so that a solder coated on the connecting portion is melted and sucked up into the through hole by a capillary action, and the step of visually recognizing the change in said state of the through hole comprises the step of visually recognizing an ascent of a solder surface in said through hole.

5. A method according to claim 1 wherein said solder is filled in the through hole in said pin terminal, and a gold plating is formed on a peripheral portion of the through hole, located on an upper surface of said pin terminal, and on the surface of the solder exposed on an upper end of the through hole wherein said step of visually recognizing the change in said state of the through hole comprises the step of visually recognizing a change in color of a golden portion of the upper surface when the connecting portion between said IC socket and the printed wiring board is heated, and the solder is melted.

6. A method according to claim 1 wherein said through hole is filled with said solder and wherein said step of visually recognizing the change in state of the through hole comprises the step of visually recognizing a descent of a solder surface in the through hole when the melted solder flows between the connecting portion and the pattern.

7. A method according to claim 6 wherein the solder is filled in the through hole in said pin terminal, and a gold plating is formed on a peripheral portion of the through hole, located on an upper surface of the pin terminal and on the surface of the solder exposed on an upper end of the through hole, wherein said step of detecting said change in said state of the through hole further comprises the step of visually recognizing a change in color of a golden portion of the upper surface when the connecting portion between said IC socket and the printed wiring board is heated, and the solder is melted.

8. A method according to claim 1 wherein said through hole has a diameter sufficiently small so that the solder coated on the connecting portion is melted and sucked up into the through hole by a capillary action, and the step of detecting the change in said state of the through hole comprises the step of visually recognizing an ascent of a solder surface in said through hole.

9. A method of checking a connection between a connecting portion of a pin terminal of an IC socket for an IC package and a pattern on a printed circuit board comprising the steps of:

filling a through hole in said pin terminal with solder;

connecting said pin terminal to said pattern;

reflowing said solder; and detecting a change in a solder level in said through hole in said pin terminal.

10. The method of claim 9 wherein said through hole has a size which does not allow a capillary action and said step of filling said through hole comprises substantially filling all of said through hole.

11. The method of claim 10 wherein said change in said solder level is a descent in said solder level.

12. The method of claim 9 wherein said through hole has a size which allows capillary action and said step of filling of said through hole comprises filling a lower portion of said through hole with said solder.

13. The method of claim 12 wherein said change in said solder level is a rise in said solder level.

14. The method of claim 12 wherein said through hole has a substantially conical shape.

15. The method of claim 9 wherein said step of filling the through hole in said pin terminal with solder comprises:

filling substantially all of said through hole with said solder; and depositing a gold plating on an upper surface of said pin terminal and on a surface of the solder exposed on an upper end of the through hole.

16. The method of claim 15 wherein said through hole has a size which does not allow a capillary action, and said change in said solder level is a descent in said solder level.

17. The method of claim 15 further comprising the step of detecting a discoloration of said gold plating on said upper surface of said pin terminal and on said surface of the solder on the upper end of said through hole, said gold plating having diffused.

* * * * *

UNITED STATES PATENT AND TRADEMARK OFFICE
CERTIFICATE OF CORRECTION

PATENT NO. : 5,699,612
DATED : December 23, 1997
INVENTOR(S) : Shuji Inoue, et al.

It is certified that error appears in the above-indentified patent and that said Letters Patent is hereby corrected as shown below:

On the title page item [73], add --ENPLAS CORPORATION--.

Signed and Sealed this

Fourth Day of August, 1998

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO. : 5,699,612
DATED : December 23, 1997
INVENTOR(S) : Inoue et al

It is certified that error appears in the above-identified patent and that said Letters Patent is hereby corrected as shown below:

In the Title Page at [73] following "Intel Corporation. Santa Clara, Calif." please insert--Enplas Corporation. Saitama, Japan--

Signed and Sealed this

First Day of December, 1998

*Attest:*

BRUCE LEHMAN

*Attesting Officer*    Commissioner of Patents and Trademarks